US008575685B2

(12) United States Patent
Bobde et al.

(10) Patent No.: US 8,575,685 B2
(45) Date of Patent: Nov. 5, 2013

(54) BURIED FIELD RING FIELD EFFECT TRANSISTOR (BUF-FET) INTEGRATED WITH CELLS IMPLANTED WITH HOLE SUPPLY PATH

(75) Inventors: Madhur Bobde, Sunnyvale, CA (US); Anup Bhalla, Santa Clara, CA (US); Hamza Yilmaz, Saratoga, CA (US); Lingpeng Guan, San Jose, CA (US); Jun Hu, San Bruno, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 257 days.

(21) Appl. No.: 13/199,381

(22) Filed: Aug. 25, 2011

(65) Prior Publication Data
US 2013/0049102 A1    Feb. 28, 2013

(51) Int. Cl.
*H01L 29/78*    (2006.01)

(52) U.S. Cl.
USPC .................................. 257/328; 257/E29.257

(58) Field of Classification Search
USPC ......................................................... 257/333
See application file for complete search history.

(56) References Cited

U.S. PATENT DOCUMENTS

| 7,518,183 | B2* | 4/2009 | Nakazawa et al. | 257/330 |
| 7,741,675 | B2* | 6/2010 | Hirler | 257/330 |
| 8,004,009 | B2* | 8/2011 | Hsieh | 257/173 |
| 2010/0171173 | A1* | 7/2010 | Hsieh | 257/333 |
| 2010/0276728 | A1* | 11/2010 | Hsieh | 257/139 |
| 2013/0020671 | A1* | 1/2013 | Lee et al. | 257/490 |

* cited by examiner

*Primary Examiner* — Stephen W Smoot
(74) *Attorney, Agent, or Firm* — Bo-In Lin

(57) ABSTRACT

This invention discloses a semiconductor power device formed in a semiconductor substrate comprises a highly doped region near a top surface of the semiconductor substrate on top of a lightly doped region. The semiconductor power device further comprises a body region, a source region and a gate disposed near the top surface of the semiconductor substrate and a drain disposed at a bottom surface of the semiconductor substrate. The semiconductor power device further comprises source trenches opened into the highly doped region filled with a conductive trench filling material in electrical contact with the source region near the top surface. The semiconductor power device further comprises a buried field ring regions disposed below the source trenches and doped with dopants of opposite conductivity from the highly doped region. In an alternate embodiment, the semiconductor power device further comprises doped regions surrounded the sidewalls of the source trenches and doped with a dopant of a same conductivity type of the buried field ring regions to function as a charge supply path.

19 Claims, 8 Drawing Sheets

BURIED FIELD RING FIELD EFFECT TRANSISTOR (BUF-FET) INTEGRATED WITH CELLS IMPLANTED WITH HOLE SUPPLY PATH

BACKGROUND OF THE INVENTION

1. Field of the Invention

The invention relates generally to semiconductor power devices. More particularly, this invention relates to new configurations and methods for manufacturing improved power device structures with buried field ring for the field effect transistor (BUF-FET) integrated with cells implanted with hole supply path for sustaining high breakdown voltage while achieving low drain to source resistance RdsA.

2. Description of the Prior Art

Conventional technologies to configure and manufacture high voltage semiconductor power devices are still confronted with difficulties and limitations to further improve the performances due to different tradeoffs. In the vertical semiconductor power devices, there is a tradeoff between the drain to source resistance, i.e., on-state resistance, commonly represented by RdsA (i.e., Rds X Active Area) as a performance characteristic, and the breakdown voltage sustainable of the power device. A commonly recognized relationship between the breakdown voltage (BV) and the RdsA is expressed as: RdsA is directly proportional to $(BV)^{2.5}$. For the purpose of reducing the RdsA, an epitaxial layer is formed with higher dopant concentration. However, a heavily doped epitaxial layer also reduces the breakdown voltage sustainable by the semiconductor power device.

Several device configurations have been explored in order to resolve the difficulties and limitations caused by these performance tradeoffs. FIG. 1A shows the cross section of a conventional floating island and thick bottom trench oxide metal oxide semiconductor (FITMOS) field effect transistor (FET) implemented with thick bottom oxide in the trench gate and floating P-dopant islands under the trench gate to improve the electrical field shape. The charge compensation of the P-dopant in the floating islands enables the increasing the N-epitaxial doping concentration, thus reduce the RdsA. In addition, the thick bottom oxide in the trench gate lowers the gate to drain coupling, thus lower the gate to drain charge Qgd. The device further has the advantage to support a higher breakdown voltage on both the top epitaxial layer and the lower layer near the floating islands. However, the presence of floating P region causes higher dynamic on resistance during switching.

In U.S. Pat. No. 5,637,898, Baliga discloses a power transistor with a specific goal of providing a high breakdown voltage and low on-state resistance. The power transistor as that shown in FIG. 1B is a vertical field effect transistor in a semiconductor substrate that includes trench having a bottom in the drift region as insulated gate electrode for modulating the conductivity of the channel and drift regions in response to the application of a turn-on gate bias. The insulated gate electrode includes an electrically conductive gate in the trench and an insulating region which lines a sidewall of the trench adjacent the channel and drift regions. The insulating region has a non-uniform cross-sectional area between the trench sidewall and the gate which enhances the forward voltage blocking capability of the transistor by inhibiting the occurrence of high electric field crowding at the bottom of the trench. The thickness of the insulating region is greater along the portion of the sidewall which extends adjacent the drift region and less along the portion of the sidewall which extends adjacent the channel region. The drift region is also non-uniformly doped to have a linearly graded doping profile that decreases in a direction from the drain region to the channel region to provide low on-state resistance. The charge compensation in this device is achieved by the gate electrode. However, the presence of a large gate electrode significantly increases the gate to drain capacitance of this structure, resulting in higher switching losses. In addition, it presents the additional manufacturing complexity of having a linearly graded doping in the drift region.

In U.S. Pat. No. 7,335,944, Banerjee et al. disclose a transistor as that shown in FIG. 1C includes first and second trenches defining a mesa in a semiconductor substrate. First and second field plate members are respectively disposed in the first and second trenches, with each of the first and second field plate members separated from the mesa by a dielectric layer. The mesa includes a plurality of sections, each section having a substantially constant doping concentration gradient, the gradient of one section being at least 10% greater than the gradient of another section, i.e., the doping profile gradient in the drift region varies as a function of the vertical depth of the drift region. Each field plate is electrically connected to the source electrode. In this device, the charge compensation is achieved by the field plate connected to the source. However, the manufacturing of this structure requires complex fabrication processes that include deep trenches and thick liner oxide.

For the above reasons, there is a need to provide new device configurations and new manufacturing methods for the semiconductor power devices reduce the on-state resistance and in the meantime increasing the breakdown voltage sustainable by the power device such that the above discussed difficulties and limitations can be resolved.

SUMMARY OF THE PRESENT INVENTION

It is therefore an aspect of the present invention to provide a new and improved semiconductor power device configuration and manufacturing method for providing a semiconductor power device with reduced RdsA and in the meantime maintain a high sustainable breakdown voltage.

Specifically, it is an aspect of the present invention to provide a new and improved device configuration and manufacturing method for providing a semiconductor power device with reduced RdsA by forming a highly doped epitaxial layer near the top surface of a semiconductor substrate and then forming conductive trenches, within the highly doped epitaxial layer, connected to a source electrode with buried field rings formed underneath each source trench to function as charge compensating layers for the highly doped drift region to enable it to sustain high voltage while maintaining low series resistance.

Another aspect of the present invention is to provide a new and improved device configuration and manufacturing method for providing a semiconductor power device that includes a top structure functioning as a MOSFET with charge compensated drift region and further provided with trenches filled with polysilicon connected to source electrode and including bottom doped regions as buried field rings with some conductive trenches having doped regions surround the trench sidewalls to function as charge supply path.

It is another aspect of the present invention to provide a new and improved device configuration and manufacturing method for providing a semiconductor power device that includes a highly doped epitaxial layer near the top surface of the device that is charge compensated by the MOS capacitor on top and buried field rings at the bottom and a lightly doped second epitaxial layer below the highly doped first epitaxial layer that has no charge compensation, and trenches to provide access to buried field rings for deeper charge compensation such that the device can achieve reduced on-state resistance while maintaining a high breakdown voltage.

Briefly in a preferred embodiment this invention discloses a semiconductor power device formed in a semiconductor substrate comprises a highly doped region near a top surface of the semiconductor substrate on top of a lightly doped region supported by a heavily doped region. The semiconductor power device further comprises a source region and a gate disposed near the top surface of the semiconductor substrate and a drain disposed at a bottom surface of the semiconductor substrate. The semiconductor power device further comprises source trenches opened into the highly doped region filled with a conductive trench filling material in electrical contact with the source region near the top surface. The semiconductor power device further comprises buried field ring regions disposed below the source trenches and doped with dopants of opposite conductivity from the highly doped region. In a preferred embodiment, the semiconductor power device further comprises doped regions surrounded the sidewalls of the source trenches and doped with a dopant of a same conductivity type of the buried field ring regions to function as a charge supply path.

Furthermore, this invention discloses a method of manufacturing a semiconductor power device in a semiconductor substrate. The method may include a step of providing a semiconductor substrate supporting a lightly doped middle layer with a highly doped top layer. The method further includes a step of opening a plurality of source trenches into the highly doped layer followed by implanting a buried field ring region below each source trench. The method further comprises a step of filling the source trenches with a conductive trench filling material to electrically contact a source electrode on the top surface of the semiconductor substrate to a source region disposed adjacent to a planar gate insulated by a gate insulation layer extending on the top surface of the semiconductor substrate. In an alternate embodiment, the step of implanting the buried field region below the source trenches further comprises a step of carrying out a tilt implant to form doped regions surrounding trench sidewalls to function as charge supply path along the source trenches extending from the highly doped top layer to the lightly doped middle layer.

These and other objects and advantages of the present invention will no doubt become obvious to those of ordinary skill in the art after having read the following detailed description of the preferred embodiment, which is illustrated in the various drawing figures.

DETAILED DESCRIPTION OF THE PREFERRED EMBODIMENTS

Figure 1A:
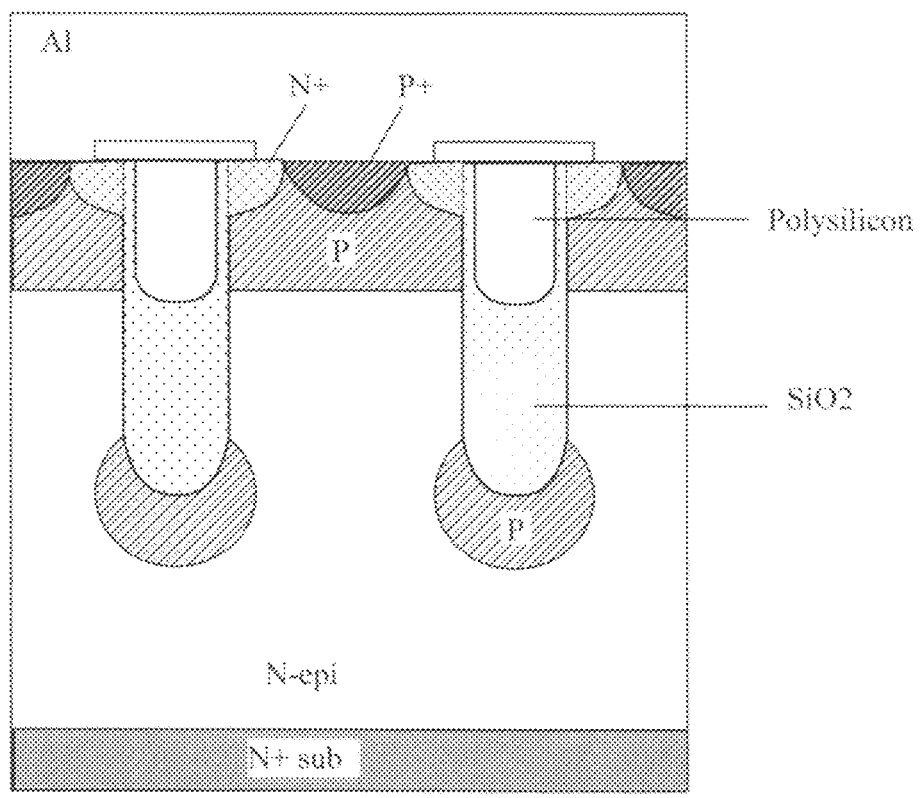
FIGS. 1A to 1C are cross sectional views showing three different configurations of conventional semiconductor power devices.
Figure 1B:
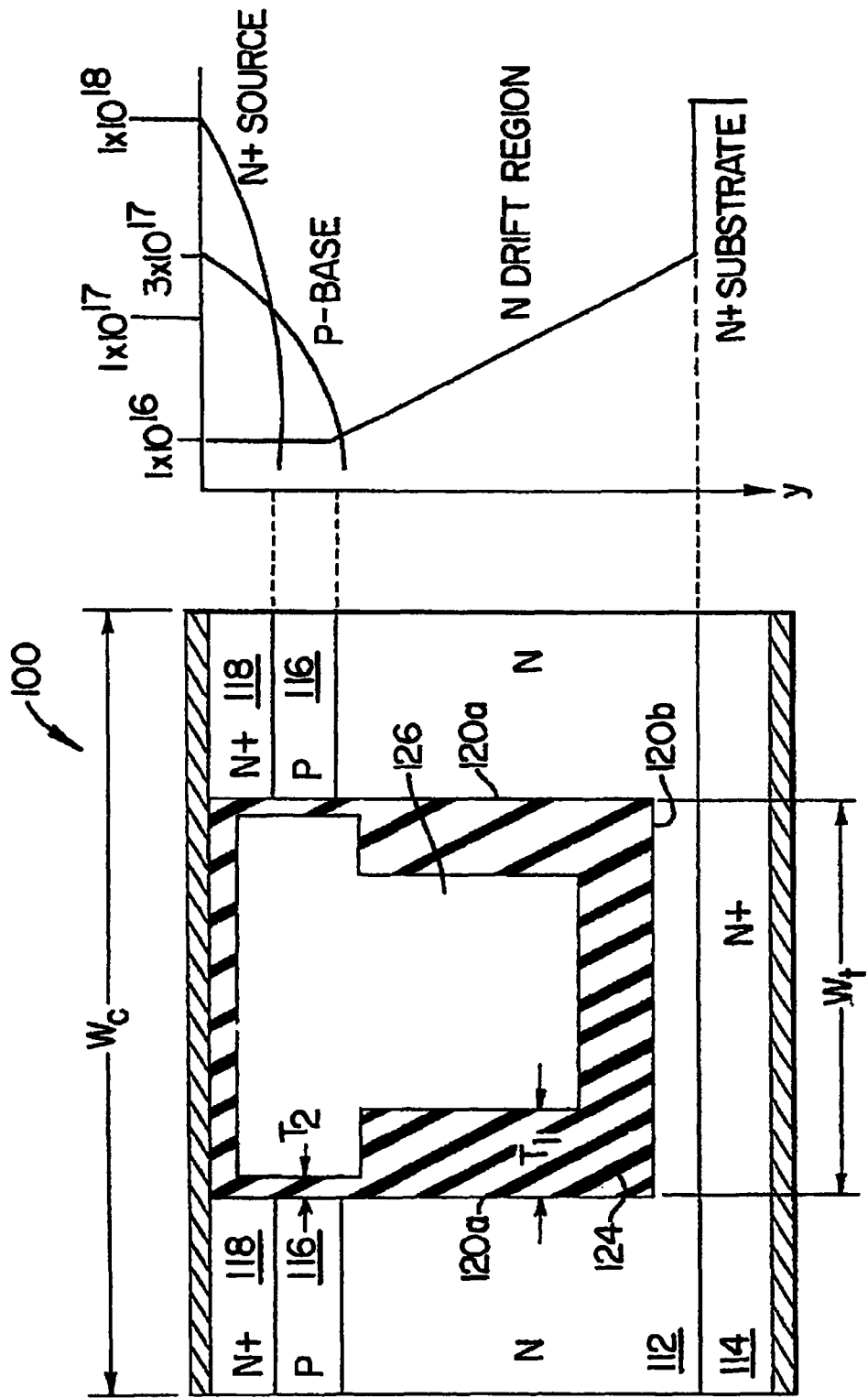
Figure 1C:
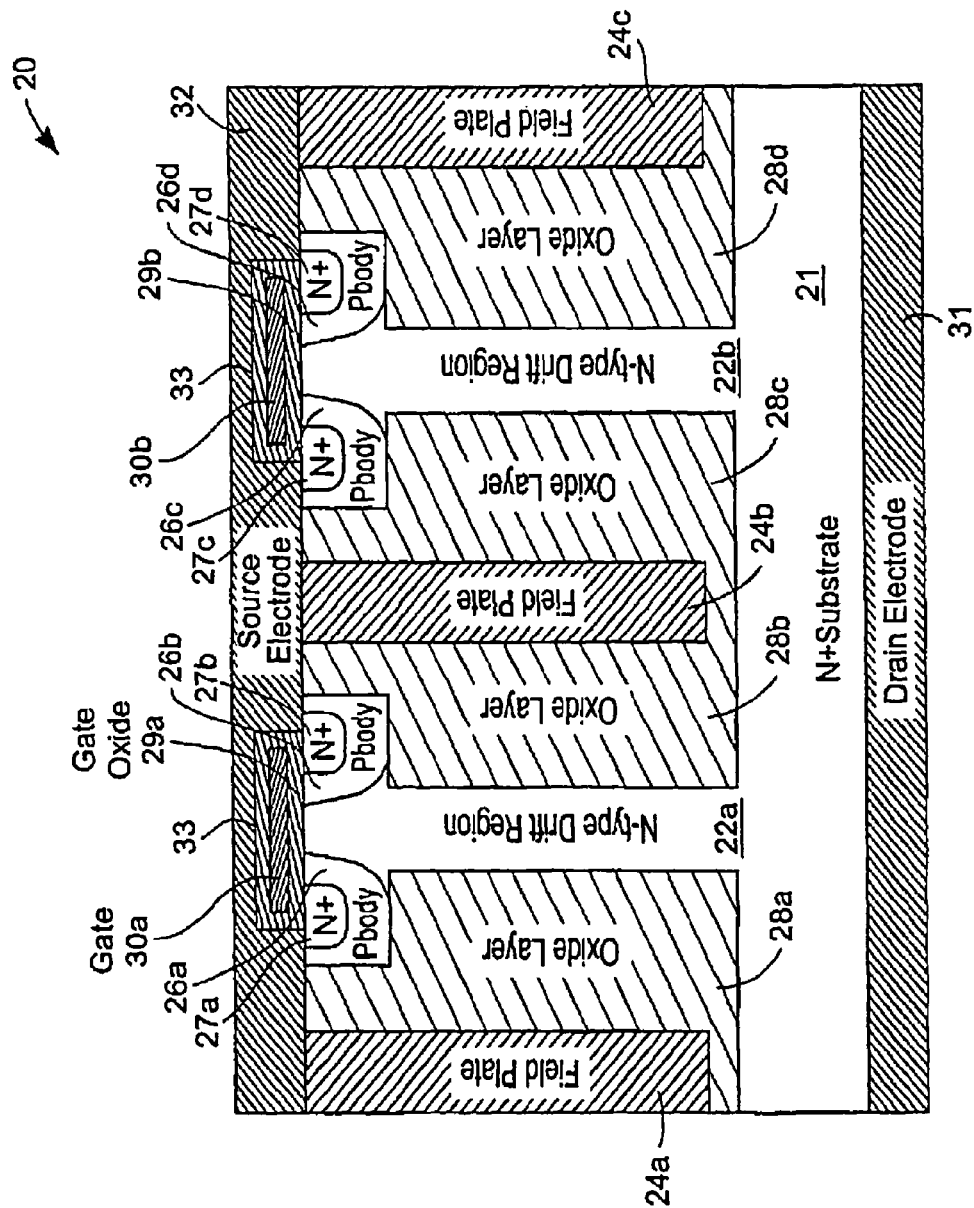
Figure 2A:
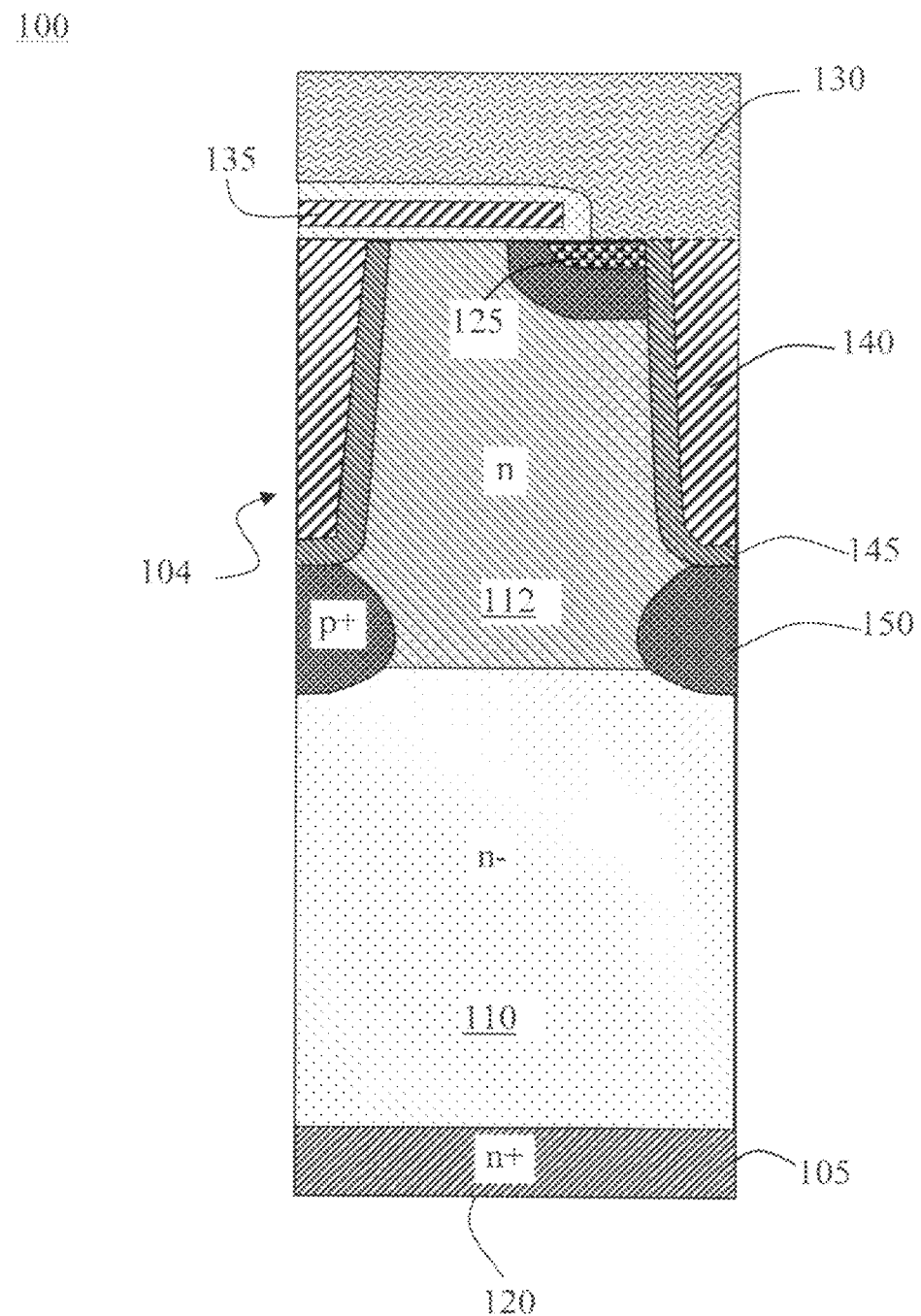
FIG. 2A is a cross sectional view of a buried field rings field effect transistor (BUF-FET).
Figure 2B:
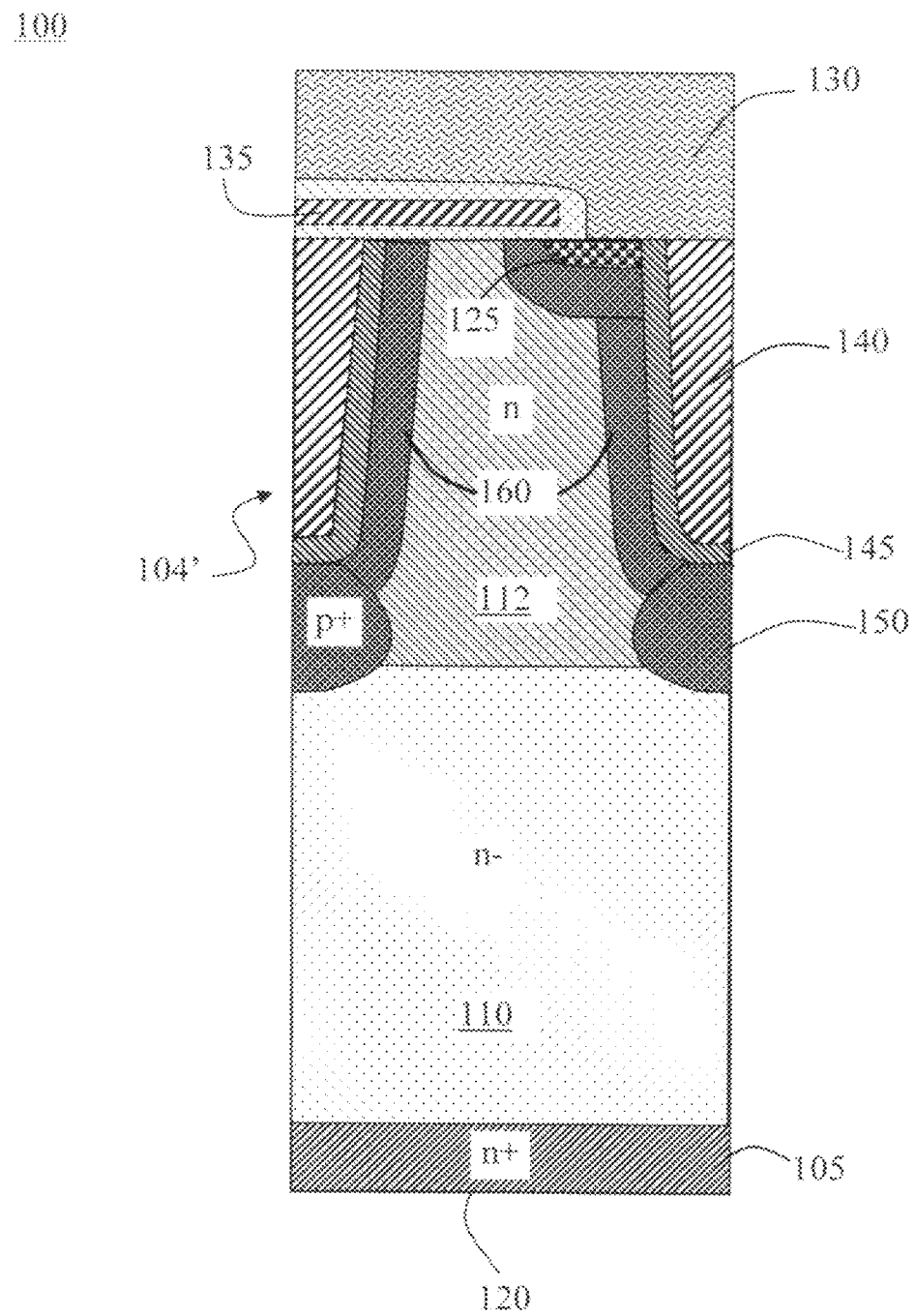
FIG. 2B is a cross sectional view of a buried field rings field effect transistor (BUF-FET) with a hole supply path.

FIGS. 2A and 2B are two cross sectional views of a buried field ring field effect transistor (BUF-FET) 100 and a BUF-FET 102 with a hole supply path of a power device of this invention. The BUF-FETs 100 and 102 are formed in a semiconductor substrate having a heavily doped region 105 of a first conductivity type, e.g., an N type substrate of a concentration of about 1e20 cm-3. A light doped region 110 of the first conductivity type, e.g., N-type doped region 110 of a concentration of about 1e14 cm-3 to 5e15 cm-3, is supported on top of the heavily doped substrate 105. A highly doped region 112, which is also of the first conductivity type of a concentration of about 1e15 cm-3 to 5e16 cm-3, is supported on top of the lightly doped region 110. Alternatively, the N type substrate 105, the lightly doped N-type layer 110 and the highly doped N-type layer 112 may together be referred to as the semiconductor substrate since they both generally have a mono-crystalline structure. Additionally, the lightly doped N-type layer 110 may be more generally referred to as a bottom or lower semiconductor layer and the highly doped N-type layer 112 may more generally be referred to as upper semiconductor layer. The BUF-FETs 100 and 102 are vertical devices with a drain (or collector) electrode 120 disposed on a bottom surface of the substrate and a source (or emitter) electrode 130 disposed on a top surface. The BUF-FETs 100 and 102 further include a plurality of trenches 104 padded with a dielectric layer such as an oxide layer 145 and filled with a polysilicon layer 140. The bottom of trenches 104 may be ended in the highly doped N-type layer 112 or extend into a top surface of the lightly doped N-type layer 110. The polysilicon layer 140 filling in the trenches 104 is connected to a source electrode 130. A source region 125 is formed near the top surface surrounding the trench 104 and is electrically connected to the source electrode 130. A planar gate 135 is formed on the top surface covering an area adjacent to the source electrode 130 and the top surface of the source region 125. The highly doped N-type layer 112 reduces the RdsA in this region and is charge compensated by the MOS capacitor on top and buried field rings at the bottom. The N-type doped epitaxial layer 110 has no charge compensation, and thus needs to be lightly doped.

In BUF-FETs 100 and 102, the trench polysilicon 140 is shorted to the source electrode for charge compensation. Furthermore, buried field rings (BUF) are formed as P-dopant regions 150 below the bottom surface of the trenches 104. Compared with BUF-FET 100, BUF-FET 102 further includes a hole-supply path formed as P-dopant regions 160 surround the trench sidewalls of some of the trenches 104', which supports to further reduce RdsA. The top side cell structure of the BUF-FET 100 s 100 and 102 are basically the same as an insulated gate bipolar transistor (IGBT) wherein the trench depth is approximately 6 microns and the liner oxide layer 145 has a thickness approximately 5500 Angstroms. The difference between a conventional IGBT and the BUF-FETs 100, 102 is that the epitaxial layer of the BUF-FETs 100, 102 includes two epitaxial layers 110 and 112 with the upper epitaxial layer 112 doped with arsenic while the lower epitaxial layer 110 doped with phosphorous. The diffusion of the phosphorous ions in the lower epitaxial layer 110 prevents the buried field ring regions 150 below the trench source from choking the current flow path. As will be further described below, the buried field ring regions 150 may be implanted after opening the trenches with a dopant concentration of 4.5e12 cm-3 with an implant energy of approximately 500 Kev. The mesa areas between the trenches 104 (or 104'), is designed to reduce the JFET resistance such that the JFET resistance may have negligible impact on RdsA. The RdsA may be reduced to a range between 20 to 80 milli-Ohm $cm^2$ when the structure is optimized. In order to further reduce the RdsA and also to maintain a high breakdown voltage, the buried field ring (BUF) dopant regions 150 is formed in a deeper depth below the N-epitaxial layer 110. The BUF-FETs 100 and 102 can be formed together in different areas of a semiconductor device. The buried field ring (BUF) dopant regions 150 are used for charge compensation for the highly doped N-epitaxial layer 112 in the active area of the semiconductor device and also serve as the buried guard rings for the termination in the device edge.

Figure 3A:
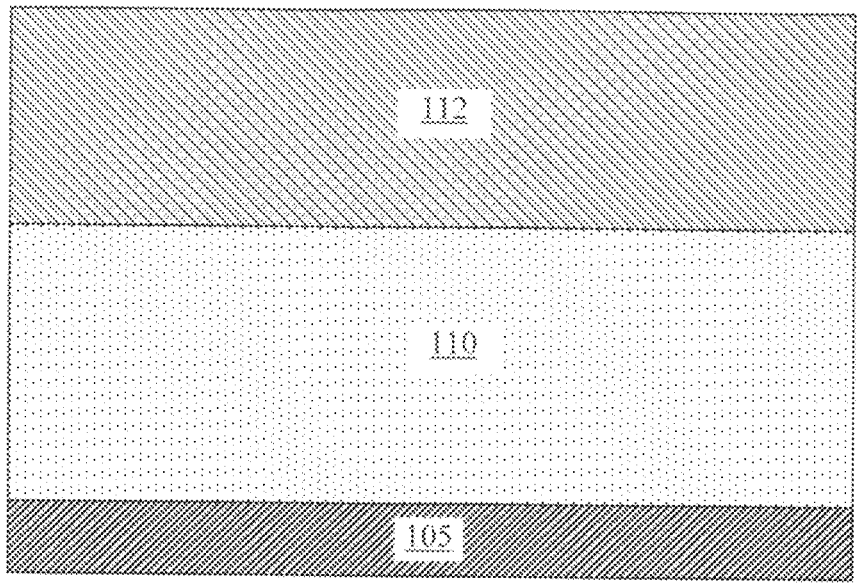
FIGS. 3A to 3D' are a series of cross sectional views for illustrating the manufacturing processes to form the semiconductor power devices of FIGS. 2A and 2B.
Figure 3B:
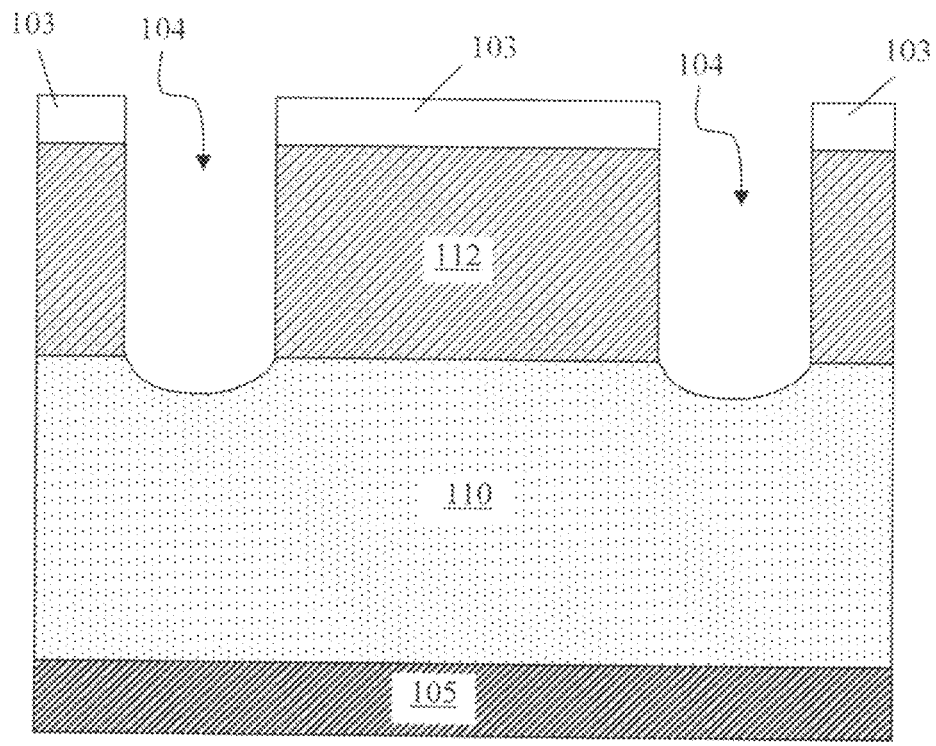
Figure 3C:
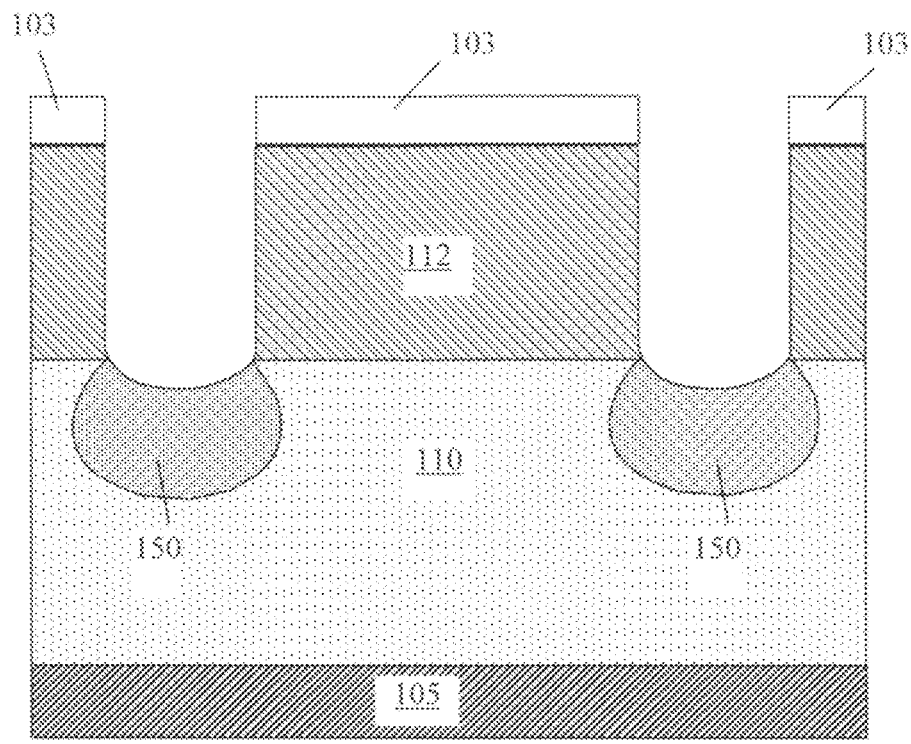
Figure 3D:
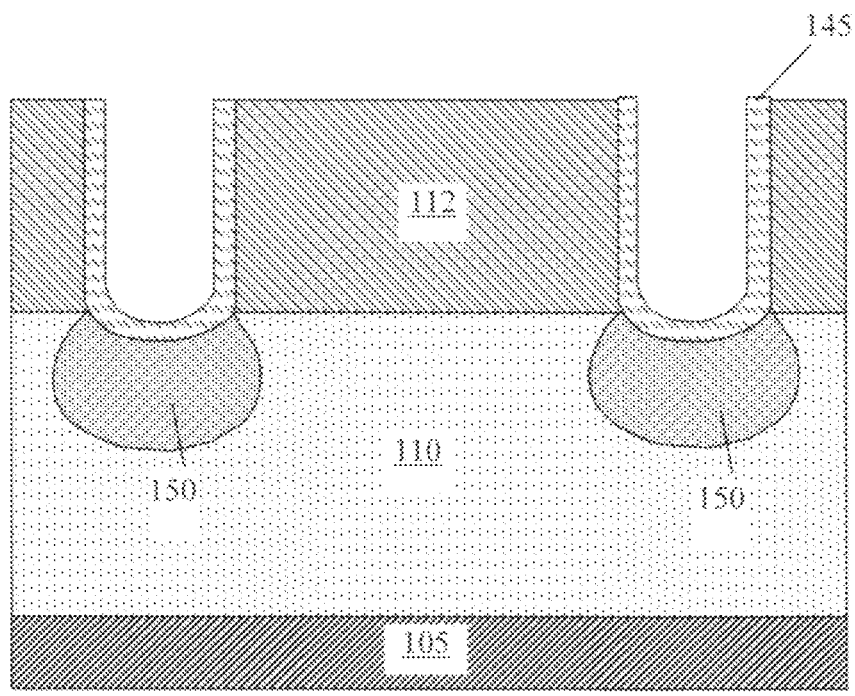
Figure 3C:
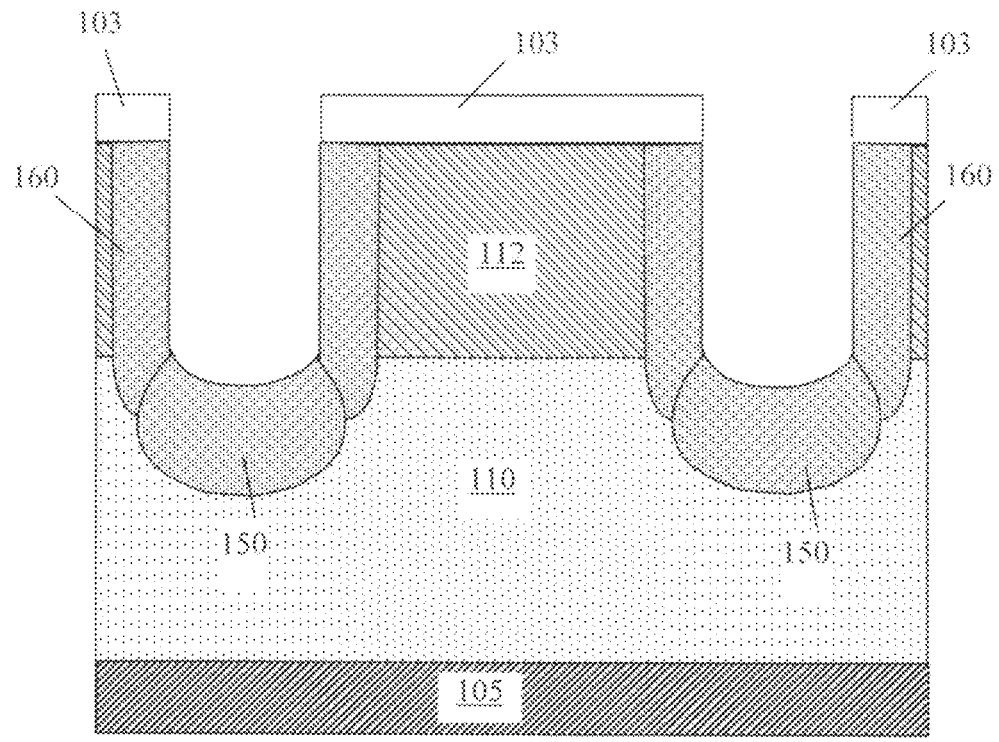
Figure 3D:
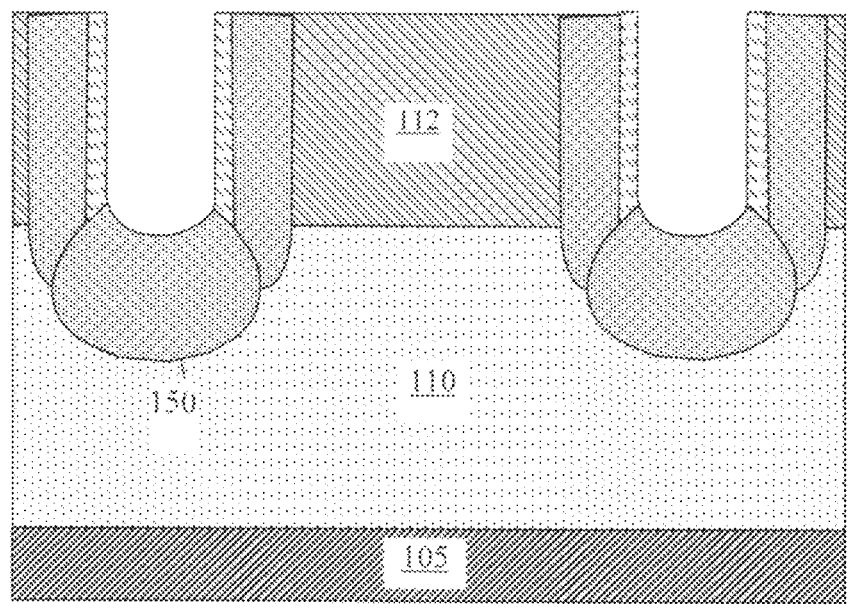

FIGS. 3A to 3D' are a series of cross sectional views illustrating the processing steps of forming a device of this invention. FIG. 3A shows a starting semiconductor substrate including an N+ bottom semiconductor layer 105 with a lightly doped N-semiconductor layer 110 supported on top of the substrate 105 and a highly doped N-semiconductor layer 112 supported on top of the lightly doped region 110. In FIG. 3B, a trench mask 103 is applied to open a plurality of trenches 104 into the top semiconductor layer 112. In FIG. 3C, P-type dopant ions are implanted through the trenches 104 to form the buried field ring regions 150 below the trenches 104. At this stage, an implant mask (not shown) is used to block some trenches from the implantation and an additional tilt P-dopant implant is carried out to form the hole-supply path P-dopant regions 160 surround the trench sidewalls of the selected trenches as that shown in FIG. 3C'. In FIGS. 3D and 3D', after the implant mask is removed, the trenches are lined with a dielectric (e.g. oxide) 145. The manufacturing process proceeds with standard processing steps to form the devices as that shown in FIGS. 2A and 2B.

Although the present invention has been described in terms of the presently preferred embodiment, it is to be understood that such disclosure is not to be interpreted as limiting. For example, though the conductivity types in the examples above often show an n-channel device, the invention can also be applied to p-channel devices by reversing the polarities of the conductivity types. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A semiconductor power device formed in a semiconductor substrate wherein:
    said semiconductor substrate having a highly doped upper layer near a top surface and a lightly doped lower layer disposed below the highly doped upper layer;
    a source region and a gate disposed near the top surface of the semiconductor substrate and a drain disposed at a bottom surface of the semiconductor substrate;
    source trenches opened into the highly doped layer padded with a trench insulation layer and filled with a conductive trench filling material in electrical contact with a source electrode on top of the top surface and in electrical contact with the source region; and
    a buried field ring region disposed below the source trenches and doped with a dopant of opposite conductivity from the highly doped upper layer.

2. The semiconductor power device of claim 1 wherein:
    the highly doped upper layer and the lightly doped lower layer are N type doped layers and the buried field ring regions are doped with a P type dopant.

3. The semiconductor power device of claim 1 wherein:
    the semiconductor substrate further comprises a heavily doped N bottom layer to function as the drain of the semiconductor substrate.

4. The semiconductor power device of claim 2 wherein:
    the highly doped upper layer having a dopant concentration ranging approximately between 1e15 cm-3 to 5e16 cm-3 and the lower lightly doped lower layer having a dopant concentration ranging approximately between 1e14 cm-3 to 5e15 cm-3.

5. The semiconductor power device of claim 3 wherein:
    the heavily doped N bottom layer having a dopant concentration ranging approximately between 1e19 cm-3 to 1e21 cm-3.

6. The semiconductor power device of claim 1 wherein:
    the highly doped upper layer and the lightly doped lower layer are N type doped layers and doped respectively with an arsenic dopant and a phosphorous dopant.

7. The semiconductor power device of claim 1 wherein:
    the source trenches are padded with an oxide layer and filled with a polysilicon as the conductive trench filling material.

8. The semiconductor power device of claim 1 wherein:
    the source trenches having a depth approximately 6 micrometers and are padded with an oxide layer having a thickness of approximately 5500 Angstroms and filled with a polysilicon as the conductive trench filling material.

9. The semiconductor power device of claim 1 wherein:
    the buried field ring regions below the source trenches are P-type dopant regions having a dopant concentration ranging approximately between 1e12 cm-3 to 1e13 cm-3.

10. The semiconductor power device of claim 1 further comprising:
    charge supply path regions surrounding sidewalls of the source trenches doped with dopant of the same conductivity type as the buried field regions.

11. A semiconductor power device formed in a semiconductor substrate wherein:
    said semiconductor substrate having a highly doped upper layer near a top surface and a lightly doped lower layer disposed below the highly doped upper layer;
    a body region, a source region and a gate disposed near the top surface of the semiconductor substrate and a drain disposed at a bottom surface of the semiconductor substrate;
    source trenches opened into the highly doped layer padded with a trench insulation layer and filled with a conductive trench filling material in electrical contact with a source electrode on top of the top surface and in electrical contact with the source region;
    a buried field ring region disposed below the source trenches and doped with a dopant of opposite conductivity from the highly doped upper layer; and
    charge supply path regions surrounding sidewalls of the source trenches doped with dopant of the same conductivity type as the buried field regions.

12. The semiconductor power device of claim 11 wherein:
    the highly doped upper layer and the lightly doped lower layer are N type doped layers and the buried field ring regions are doped with a P type dopant.

13. The semiconductor power device of claim 11 wherein:
    the semiconductor substrate further comprises a heavily doped N bottom layer to function as the drain of the semiconductor substrate.

14. The semiconductor power device of claim 12 wherein:
    the highly doped upper layer having a dopant concentration ranging approximately between 1e15 cm-3 to 5e16 cm-3 and the lower lightly doped lower layer having a dopant concentration ranging approximately between 1e14 cm-3 to 5e15 cm-3.

15. The semiconductor power device of claim 13 wherein:
the heavily doped N bottom layer having a dopant concentration ranging approximately between 1e19 cm-3 to 1e21 cm-3.

16. The semiconductor power device of claim 11 wherein:
the highly doped upper layer and the lightly doped lower layer are N type doped layers and doped respectively with an arsenic dopant and a phosphorous dopant.

17. The semiconductor power device of claim 11 wherein:
the source trenches are padded with an oxide layer and filled with a polysilicon as the conductive trench filling material.

18. The semiconductor power device of claim 11 wherein:
the source trenches having a depth approximately 6 micrometers and are padded with an oxide layer having a thickness of approximately 5500 Angstroms and filled with a polysilicon as the conductive trench filling material.

19. The semiconductor power device of claim 11 wherein:
the buried field rings regions below the source trenches and the charge supply path regions surrounding the trench sidewalls are P-type dopant regions having a dopant concentration ranging approximately between 1e14 cm-3 to 1e16 cm-3.

* * * * *